United States Patent [19]

Hölzle

[11] Patent Number: 5,079,446

[45] Date of Patent: Jan. 7, 1992

[54] CIRCUIT CONFIGURATION FOR GENERATING COMBINATORIAL BINARY LOGIC FUNCTIONS WITH MULTIPLEXERS AND INVERTERS

[75] Inventor: Josef Hölzle, Bad Wörishofen, Fed. Rep. of Germany

[73] Assignee: Siemens Aktiengesellschaft, Munich, Fed. Rep. of Germany

[21] Appl. No.: 586,402

[22] Filed: Sep. 21, 1990

[30] Foreign Application Priority Data

Sep. 21, 1989 [EP] European Pat. Off. ...... 89-117-473.2

[51] Int. Cl.$^5$ .................... H03K 19/02; H03K 19/173
[52] U.S. Cl. .................................. 307/440; 307/445; 307/465; 307/243
[58] Field of Search ............... 307/440, 443, 445, 243, 307/465

[56] References Cited

U.S. PATENT DOCUMENTS

| 4,366,393 | 12/1982 | Kasuya .............................. 307/440 |
| 4,670,846 | 6/1987 | Laws ................................. 307/440 |
| 4,818,902 | 4/1989 | Brockmann ....................... 307/243 |
| 4,825,105 | 4/1989 | Hölzle .............................. 307/243 |
| 4,866,310 | 9/1989 | Ando et al. ....................... 307/443 |

FOREIGN PATENT DOCUMENTS 0176938  5/1990  European Pat. Off. .

OTHER PUBLICATIONS

Publication Electronics International, vol. 50, No. 9, Apr. 1977, pp. 120–121, New York, U.S.; J. E. Siebert: "Digital multiplexers reduce chip count in logic design".

*Primary Examiner*—Stanley D. Miller
*Assistant Examiner*—Margaret R. Wambach
*Attorney, Agent, or Firm*—Herbert L. Lerner; Laurence A. Greenberg

[57] ABSTRACT

A circuit configuration for generating combinatorial logic functions includes a plurality of cascading circuit blocks, which are each formed of a 1-out-of-4 multiplexer and an inverter. Control inputs of the multiplexer are acted upon by input variables having a higher significance and data inputs are acted upon by a logical zero, a logical one, least significant input variables or inverted least significant input variables, in dependence on a linking function.

3 Claims, 1 Drawing Sheet

CIRCUIT CONFIGURATION FOR GENERATING COMBINATORIAL BINARY LOGIC FUNCTIONS WITH MULTIPLEXERS AND INVERTERS

The invention relates to a circuit configuration for generating combinatorial binary logic functions with multiplexers and inverters, having an output state unequivocally fixed by a linking function and defined by at least one output variable for each input state defined by a combination of input variables, the linking function being composed of at least one partial linking function, circuit blocks corresponding to each of the partial linking functions, one circuit block being provided for linking three input variables with one output variable, the one circuit block including a 1-out-of-4 multiplexer and an inverter, two control inputs of the multiplexer being acted upon by the higher-significance input variables; and the data input of the multiplexer selected by the higher-significance input variables being acted upon a logical zero whenever the states of the two output variables associated with the two possible states of the least significant variables as a result of the partial linking function equal zero; or being acted upon by a logical one whenever the states of the output variables associated with the two possible states of the least significant variables as a result of the partial linking function are equal to one; or being acted upon by the least significant input variables whenever the states of the output variables associated with the two states of the least significant variables as a result of the partial linking function are equal to the states of the least significant input variables; or being acted upon by the inverted least significant input variables whenever the states of the output variables associated with the two possible states of the least significant input variables as a result of the partial linking function are equal to the states of the inverted least significant input variables.

Circuit configurations for generating combinatorial binary logic functions are among the fundamental circuits of digital technology and are typically made with two-stage OR/AND, or AND/OR gate configurations, or with the aid of multiplexers and inverters. A basic requirement for constructing such circuit configurations is to make do with a minimum of switch elements for a reasonable expenditure of time. As a rule, to solve a given problem, either minterms, i.e., conjunctions, or maxterms, i.e. disjunctions of all of the variables are used. Either the minterms that effect a logical 1 in the command function, or the maxterms in which the command function has a logical 0, are used.

Options for minimizing the expense for circuitry are offered by Boolean algebra, the McCluskey method, or Karnaugh diagrams. However, such known methods are either hard to manipulate, time-consuming, or limited to a certain number of input variables. Boolean algebra merely uses formal methods without a system; the McCluskey method is schematic but tedious; and Karnaugh diagrams are only easily manipulable when there are no more than five input variables.

"Electronics International", Vol. 50, No. 9, April 1977, pp. 120–121, discloses a circuit configuration with a circuit block of the generic type mentioned herein, which is provided for three input variables and one output variable. If there are more than three input variables, 1-out-of-8 multiplexers are used, in which each provides the same input variables to the control inputs. Even with five input variables, difficulties arise with respect to achieving a simple circuit structure. Furthermore, each additional input variable doubles the expense for multiplexers.

A circuit is also disclosed in European Patent No. 0 176 938 B1 that generates logical basic functions with the aid of multiplexers and inverters, to which equal-sized blocks having logic combinations are equivalent, from the respective input variables having the least significance. The possible output states are the result of a combination of the blocks. The blocks occupy the data inputs of a multiplexer circuit and when the input variables with which the logic combinations of the blocks are associated are combined, the blocks are passed on to the output of the multiplexer circuit. The selection of the particular correct block at a given time is defined by the input variables having the greatest significance that occupy the control inputs of the multiplexer circuit. A disadvantage of the known circuit configuration is that dissimilar circuit structures are required in order to generate dissimilar logic, that is circuit configurations having a dissimilar linking function between the input variables and the output variables.

It is accordingly an object of the invention to provide a circuit configuration for generating combinatorial binary logic functions with multiplexers and inverters, which overcomes the hereinafore-mentioned disadvantages of the heretofore-known devices of this general type and in which the linking function is adjustable without changing the circuit structure.

With the foregoing and other objects in view there is provided, in accordance with the invention, in a circuit configuration for generating combinatorial binary logic functions with multiplexers and inverters having input states defined by a combination of input variables, an output state for each of the input states being unequivocally fixed by a linking function and defined by at least one output variable, the linking function being formed of at least one partial linking function, circuit blocks corresponding to each of the partial linking functions, one of the circuit blocks linking three of the input variables with one output variable, the one circuit block including a 1-out-of-4 multiplexer and an inverter, the multiplexer having two control inputs being acted upon by higher-significance input variables; and the multiplexer having data inputs selected by the higher-significance input variables being acted upon by a logical zero whenever the states of the two output variables associated with the two possible states of the least significant variables equal zero as a result of the partial linking function; a logical one whenever the states of the output variables associated with the two possible states of the least significant variables are equal to one as a result of the partial linking function; least significant input variables whenever the states of the output variables associated with the two states of the least significant variables are equal to the states of the least significant input variables as a result of the partial linking function; and inverted least significant input variables whenever the states of the output variables associated with the two possible states of the least significant input variables are equal to the states of the inverted least significant input variables as a result of the partial linking function; wherein the improvement comprising more than three input variables, and the circuit blocks being identical; or more than one output variable, and the circuit blocks being identical; or three input variables and a plurality of output variables, and the circuit blocks having input sides connected in parallel; or more than three input variables and one output variable, and the circuit blocks having a first portion being acted upon by each of three input variables and issuing outputs, and a further portion being acted upon by the outputs of the first portion and left-over input variables; or more than three input variables and more than one output variable, and the circuit blocks having a plurality of first and second portions being connected in parallel.

The advantages of the invention, aside from the easily manipulated and non-time-consuming adjustment of the linking function of the circuit configuration, include the possibility of arbitrary and even retroactively variable generation of combinatorial logic functions, which can thus be performed by computer control as well, and a circuit configuration signal delay time that is independent of the linking function.

Other features which are considered as characteristic for the invention are set forth in the appended claims.

Although the invention is illustrated and described herein as embodied in a circuit configuration for generating combinatorial binary logic functions with multiplexers and inverters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
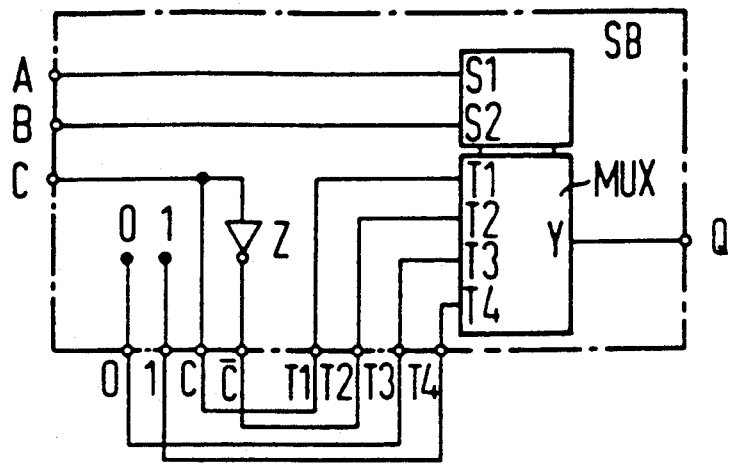
FIG. 1 is a schematic and block circuit diagram of a first exemplary embodiment of a circuit configuration according to the invention, having three input variables and one output variable.

Referring now to the figures of the drawing in detail and first, particularly, to FIG. 1 thereof, there is seen a circuit configuration according to the invention which includes at least one circuit block SB, having a 1-out-of-4 multiplexer MUX and an inverter Z. Of three input variables A, B, C, the two input variables A, B having the higher significance are applied to control inputs S1 and S2 of the multiplexer MUX. The least significant input variables C, along with a logical zero 0, a logical one 1, and the least significant input variable C inverted by the inverter Z, are all provided for acting upon data inputs T1–T4 of the multiplexer MUX, depending on the particular linking function to be performed at a given time. The data input T1–T4 selected by the higher-significance input variables A, B is acted upon by a logical zero 0 whenever the states of output variables Q associated with the two states of the least significant variables C equal zero as a result of the partial linking function; or is acted upon by a logical one 1 whenever the states of the output variables Q associated with the two possible states of the least significant variables C are equal to one 1 as a result of the partial linking function; or is acted upon by the least significant input variables C whenever the states of the output variables Q associated with the two states of the least significant variables C are equal to those of the least significant input variables C as a result of the partial linking function; or is acted upon by the inverted least significant input variables C, whenever the states of the output variables Q associated with the two possible states of the least significant variables C are equal to those of the inverted least significant input variables C as a result of the partial linking function.

In the exemplary embodiment of FIG. 1, the linking function to be realized is shown in the form of a values table identified as Table 1 below.

TABLE 1

|    | A | B | C | Q |     |
|----|---|---|---|---|-----|
| T1 | 0 | 0 | 0 | 0 | = C |
|    | 0 | 0 | 1 | 1 |     |
| T2 | 0 | 1 | 0 | 1 | = C |
|    | 0 | 1 | 1 | 0 |     |
| T3 | 1 | 0 | 0 | 0 | = 0 |
|    | 1 | 0 | 1 | 0 |     |
| T4 | 1 | 1 | 0 | 1 | = 1 |
|    | 1 | 1 | 1 | 1 |     |

This table lists all of the possible combinations of the input variables A, B, C that can assume the states zero 0 and one 1 and that define an input state as a combination; a corresponding state of the output variables Q has been associated with each input state.

Since the higher-significant input variables A, B each select one data input T1-T4 of the multiplexer MUX, the values table can be divided into four zones, in each of which one of the data inputs T1-T4 is connected through to an output Y of the multiplexer MUX and thus to the output of the circuit block SB carrying the output variable Q. In each of these zones, the two states of zero 0 and one 1 occur at the least significant variables C. Associated with this are the states of the output variables Q. There are four possible associations: namely, that their states are equal to the states of the least significant input variables C; that they are equal to the states of the least significant inverted input variables C; that they are equal to zero 0 in both cases; or that they are equal to one 1 in both cases. If the respectively selected data inputs are then acted upon by the resultant constant or variables, then the circuit block SB generates logic functions with a linking function defined by the values table, which is Table 1. Thus in accordance with Table 1, in the present exemplary embodiment, the least significant input variable is applied to the data input T1; the inverted least significant input C is applied to the data input T2; the constant zero 0 is applied to the data input T3; and the constant one 1 is applied to the data input T4.

Figure 2:
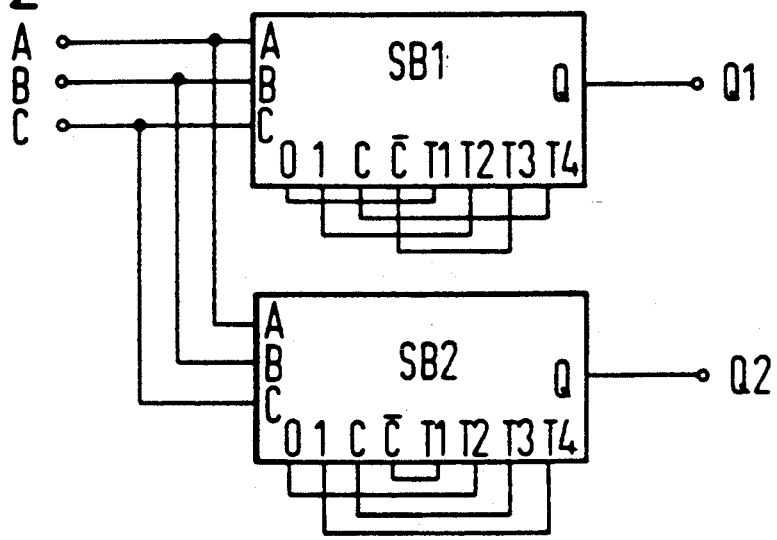
FIG. 2 is a circuit diagram of a second exemplary embodiment of a circuit configuration according to the invention, having three input variables and two output variables.

In order to attain linking functions with more than three input variables and more than one output variable, the invention provides that the linking function is split up into a plurality of partial linking functions, with three input variables and one output variable. If the number of output variables is increased, the corresponding number of circuit blocks SB is connected parallel one the input side for that purpose. The exemplary embodiment of FIG. 2 shows a circuit configuration having three input variables and two output variables.

Two circuit blocks SB1 and SB2, having a structure identical to the circuit block SB, are acted upon with the input variables A, B, C on the input side. For this purpose, a values table of the linking function to be performed, which is identified as Table 2, is split up into two values tables, each having three input variables, which are then each provided by one circuit block SB1, SB2 having the input variables A, B, C and the output variables Q1, Q2.

TABLE 2

|    | A | B | C | Q1 (SB1) | Q2 (SB2) |
|----|---|---|---|----------|----------|
| T1 | 0 | 0 | 0 | 0        | 1        |
|    |   |   |   | = 0      | = C      |
|    | 0 | 0 | 1 | 0        | 0        |
| T2 | 0 | 1 | 0 | 1        | 0        |
|    |   |   |   | = 1      | = 0      |
|    | 0 | 1 | 1 | 1        | 0        |
| T3 | 1 | 0 | 0 | 1        | 1        |
|    |   |   |   | = C      | = C      |
|    | 1 | 0 | 1 | 0        | 0        |
| T4 | 1 | 1 | 0 | 0        | 1        |
|    |   |   |   | = C      | = 1      |
|    | 1 | 1 | 1 | 1        | 1        |

The outcome of this is that in the circuit block SB1, the input T1 is acted upon by the constant zero 0; the input T2 is acted upon by the constant one 1; the data input T3 is acted upon the variable C; and the data input T4 is acted upon by the input variable C. In the second circuit block SB2, the input T1 is acted upon by the input variable C; the input T2 is acted upon by the constant zero 0; the data input T3 is acted upon the input variable C; and the input T4 is acted upon by the constant one 1.

Figure 3:
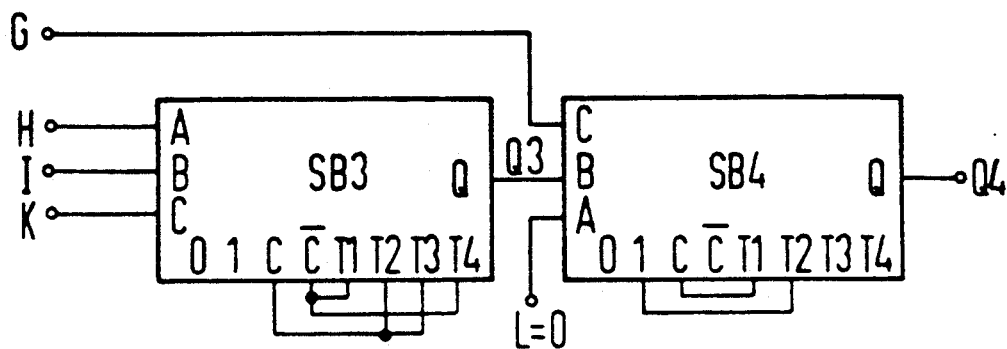
FIG. 3 is a circuit diagram of a third exemplary embodiment of a circuit configuration according to the invention, having four input variables and one output variable.

In order to increase the number of input variables, these variables are each split into groups of three and then each are delivered to one circuit block. The outputs of the circuit blocks in turn are split into groups of three and delivered to further circuit blocks, or additional input and output variables that are left over when groups of three are formed are combined into groups of three and delivered to circuit blocks. The exemplary embodiment of FIG. 3 shows a circuit configuration having four input variables G, H, I, K and one output variable Q4. For this purpose, a values table of the linking function to be realized, which is identified as Table 3, is split into one group of three having the three input variables H, I, K, and the remaining input variable G. The group of three is supplied to a circuit block SB3. The remaining input variable G is combined with an output variable Q3 of the circuit block SB3 and a further input variable L to make a group of three, which is applied to a circuit block SB4. The further input variable L is set to equal zero 0. An OR function may, for instance, be provided as the linking function of the input variables L and G and of the output variables Q3 in the circuit block SB4, which as Table 4 shows results in a layout of the circuit block SB4 in such a way that the input T1 is acted upon by the input variable C and the data input T2 is acted upon by the constant one 1. Since the input variable L is set equal to zero, the data inputs T3 and T4 are not connected through. By splitting off the input variable G in Table 3, a relationship as shown in Table 5 is obtained.

TABLE 3

| G | H | I | K | Q4 | Q3 |
|---|---|---|---|----|----|
| 0 | 0 | 0 | 0 | 1  | 1  |
| 0 | 0 | 0 | 1 | 0  | 0  |
| 0 | 0 | 1 | 0 | 0  | 0  |
| 0 | 0 | 1 | 1 | 1  | 1  |
| 0 | 1 | 0 | 0 | 0  | 0  |
| 0 | 1 | 0 | 1 | 1  | 1  |
| 0 | 1 | 1 | 0 | 1  | 1  |
| 0 | 1 | 1 | 1 | 0  | 0  |
| 1 | 0 | 0 | 0 | 0  | 1  |
| 1 | 0 | 0 | 1 | 1  | 0  |
| 1 | 0 | 1 | 0 | 1  | 0  |
| 1 | 0 | 1 | 1 | 0  | 1  |
| 1 | 1 | 0 | 0 | 1  | 0  |
| 1 | 1 | 0 | 1 | 0  | 1  |
| 1 | 1 | 1 | 0 | 0  | 1  |
| 1 | 1 | 1 | 1 | 1  | 0  |

TABLE 4

|    | L | Q3 | G | Q4 (SB4) |
|----|---|----|---|----------|
| T1 | 0 | 0  | 0 | 0        |
|    |   |    |   | G        |
|    | 0 | 0  | 1 | 1        |
| T2 | 0 | 1  | 0 | 1        |
|    |   |    |   | 1        |
|    | 0 | 1  | 1 | 1        |

TABLE 5

|    | H | I | K | Q3 (SB3) |
|----|---|---|---|----------|
| T1 | 0 | 0 | 0 | 1        |
|    |   |   |   | = K      |
|    | 0 | 0 | 1 | 0        |
| T2 | 0 | 1 | 0 | 0        |
|    |   |   |   | K        |
|    | 0 | 1 | 1 | 1        |
| T3 | 1 | 0 | 0 | 0        |
|    |   |   |   | K        |
|    | 1 | 0 | 1 | 1        |
| T4 | 1 | 1 | 0 | 1        |
|    |   |   |   | K        |
|    | 1 | 1 | 1 | 0        |

The outcome for the circuit block SB3 is that the data inputs T1 and T4 are acted upon by the input variables C, and the inputs T2 and T3 are acted upon by the input variables C. According to the invention, the circuit blocks SB3 and SB4 are likewise identical in structure to the circuit block SB.

In closing, it should be pointed out that by means of parallel and series circuitry, linkages of an arbitrary number of input variables with an arbitrary number of output variables are possible.

I claim:

1. Circuit configuration for generating a binary logic function, comprising:
    a) means for generating more than one output signal from three input signals in accordance with the logic function;
    b) a plurality of circuit blocks each having three inputs and an output for producing one output signal from the three input signals according to logic sub-functions comprising the logic function;

c) said circuit blocks each including an inverter and a 1-out-of-4 multiplexer having two control inputs, four data inputs and one data output;

d) said two control inputs of each of said 1-out-of-4 multiplexers being connected to two of said three inputs of a respective one of said circuit blocks;

e) said data output of each of said 1-out-of-4 multiplexers being connected with said output of a respective one of said circuit blocks;

f) each of said data inputs of each of said 1-out-of-4 multiplexers, depending on said logic sub-function to be realized, being connected with one of the third of said three inputs of a respective one of said circuit blocks, the third input of said three inputs of a respective one of said circuit blocks inverted by said inverter, a potential corresponding to a logical 1, and a potential corresponding to a logical 0; and g) said inputs of said plurality of circuit blocks being connected in parallel.

2. Circuit configuration for generating a binary logic function, comprising:

a) means for generating a single output signal from more than three input signals in accordance with a logic function;

b) a plurality of circuit blocks subdivided into first and second groups, each of said blocks having three inputs and an output for producing an output signal from the three input signals according to logic sub-functions comprising the logic functions;

c) said circuit blocks each including an inverter and a 1-out-of-4 multiplexer having two control inputs, four data inputs and one data output;

d) said two control inputs of each of said 1-out-of-4 multiplexers being connected to two of said three inputs of a respective one of said circuit blocks;

e) said data output of each of said 1-out-of-4 multiplexers being connected with said output of a respective one of said circuit blocks;

f) each of said data inputs of each of said 1-out-of-4 multiplexers, depending on said logic sub-function to be realized, being connected with one of the third of said three inputs of a respective one of said circuit blocks, the third input of said three inputs of a respective one of said circuit blocks inverted by said inverter, a potential corresponding to a logical 1, and a potential corresponding to a logical 0;

g) said inputs of said circuit blocks of said first group each receiving three input signals of the circuit configuration, and said inputs of said circuit blocks of said second group each receiving the output signals of said first group and extraneous input signals of the circuit configuration.

3. Circuit configuration for generating binary logic functions, comprising:

a) means for generating more than one output signal from more than three input signals in accordance with a logic function;

b) a plurality of first and second groups of circuit blocks connected in parallel on an input side, said groups each including a plurality of circuit blocks, each of said blocks having three inputs and an output for producing an output signal from the three input signals according to logic sub-functions comprising the logic function;

c) said circuit blocks each including an inverter and a 1-out-of-4 multiplexer having two control inputs, four data inputs and one data output;

d) said two control inputs of each of said 1-out-of-4 multiplexers being connected to two of said three inputs of a respective one of said circuit blocks;

e) said data output of each of said 1-out-of-4 multiplexers being connected with said output of a respective one of said circuit blocks;

f) each of said data inputs of each of said 1-out-of-4 multiplexers, depending on said logic sub-function to be realized, being connected with one of the third of said three inputs of a respective one of said circuit blocks, the third input of said three inputs of a respective one of said circuit blocks inverted by said inverter, a potential corresponding to a logical 1, and a potential corresponding to a logical 0; and g) said inputs of said circuit blocks of said first group each receiving three input signals of the circuit configuration, and said inputs of said circuit blocks of said second group each receiving the output signals of said first group and extraneous input signals of the circuit configuration.

* * * * *